US005965326A

United States Patent [19]

Ellis

[11] Patent Number: 5,965,326

[45] Date of Patent: Oct. 12, 1999

[54] METHOD FOR SELECTIVELY DELETING UNDESIRED INK-RECEPTIVE AREAS ON WET LITHOGRAPHIC PRINTING CONSTRUCTIONS INCORPORATING METALLIC INORGANIC LAYERS

[75] Inventor: Ernest W. Ellis, Harvard, Mass.

[73] Assignee: Presstek, Inc., Hudson, N.H.

[21] Appl. No.: 08/786,827

[22] Filed: Jan. 21, 1997

[51] Int. Cl.$^{6}$ .............................. B41C 1/10; G03F 7/02; B41M 1/08

[52] U.S. Cl. ....................... 430/309; 430/271.1; 430/302; 427/140; 427/142; 106/2; 101/465; 101/466; 101/467

[58] Field of Search ................................ 106/2; 101/465, 101/466, 467; 430/309, 302; 427/140, 142

[56] References Cited

U.S. PATENT DOCUMENTS

| | | | |
|---|---|---|---|
| 3,293,186 | 12/1966 | Chu et al. | 252/79.2 |
| 4,778,616 | 10/1988 | Gillich | 252/135 |
| 5,159,879 | 11/1992 | Urabe et al. | 101/465 |
| 5,161,465 | 11/1992 | Lewis et al. | 101/467 |
| 5,342,435 | 8/1994 | Walls | 106/2 |
| 5,783,364 | 7/1998 | Ellis et al. | 430/302 |
| 5,807,658 | 9/1998 | Ellis et al. | 430/302 |

FOREIGN PATENT DOCUMENTS

| | | |
|---|---|---|
| 0482653A1 | 4/1992 | European Pat. Off. . |
| 57073742 | 5/1982 | Japan . |

OTHER PUBLICATIONS

Mitsubishi Paper Mills Ltd., WPI Data Base Entry XP-002066841 (Feb. 21, 1976).

Fuji Photo Film KK, Japanese Patent Gazette pp. 765 22 X, XP-002066840, Nov. 17, 1976.

*Primary Examiner*—Cynthia Hamilton

*Attorney, Agent, or Firm*—Cesari and McKenna, LLP

[57] ABSTRACT

To delete undesired ink-receptive areas on a wet lithographic printing construction, an oleophobic material is applied to the hydrophilic surface of the plate that has suffered contamination and/or scratching, and allowed to cure. So long as the hydrophilic surface is capable of permanently bonding the oleophobic deletion agent, the areas to which that agent has been applied will not accept ink.

17 Claims, 1 Drawing Sheet

Figure 1:
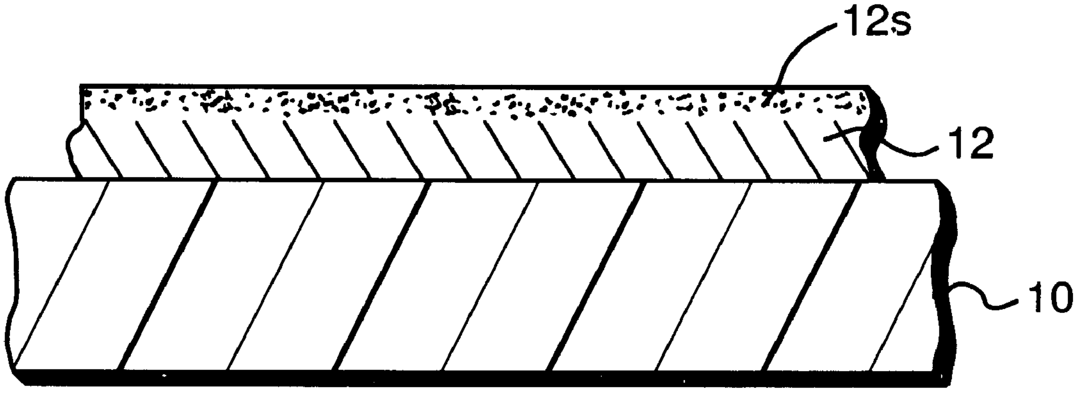

METHOD FOR SELECTIVELY DELETING UNDESIRED INK-RECEPTIVE AREAS ON WET LITHOGRAPHIC PRINTING CONSTRUCTIONS INCORPORATING METALLIC INORGANIC LAYERS

BACKGROUND OF THE INVENTION

1. Field of the Invention

The present invention relates to digital printing apparatus and methods, and more particularly to repair or alteration of lithographic printing plate constructions that may be imaged on- or off-press using digitally controlled laser output.

2. Description of the Related Art

In offset lithography, an image to be transferred to a recording medium is represented on a plate, mat or other printing member as a pattern of ink-accepting (oleophilic) and ink-repellent (oleophobic) surface areas. In a dry offset printing system, the member is simply inked and the image transferred onto a recording material; the member first makes contact with a compliant intermediate surface called a blanket cylinder which, in turn, applies the image to the paper or other recording medium. In typical sheet-fed press systems, the recording medium is brought into contact with the blanket cylinder by an impression cylinder.

In a wet lithographic system, the non-image areas are hydrophilic, and the necessary ink-repellency is provided by an initial application of a dampening (or "fountain") solution to the printing member prior to or in conjunction with inking. The ink-rejecting fountain solution prevents ink from adhering to the non-image areas, but does not affect the oleophilic character of the image areas.

U.S. Pat. Nos. 5,339,737 and 5,379,698 disclose a variety of, inter alia, dry lithographic plate configurations for use with imaging apparatus that operate by laser discharge. These plates may be imaged on a stand-alone platemaker or directly on-press, and feature silicone or fluoropolymer surface layers of sufficiently low surface energy to repel ink. Accordingly, ink may be applied to these plates directly, without the use of fountain solution as an abhesive agent. More traditionally, silicone-surfaced plates have been prepared for imaging by photoexposure. The silicone surface layer is typically a photopolymerizable polyorganosiloxane, selective exposure of which to actinic (usually ultraviolet) radiation cures the material in an imagewise pattern; unexposed portions are removed by a photographic development process. See, e.g., U.S. Pat. Nos. 4,019,904 and 4,853,313.

The acceptability of the ultimate printed image, of course, depends on more than accurate imaging; the printing member must be free of surface and structural imperfections that themselves mar the imagewise pattern. Particularly in the case of traditional, planar constructions that are individually taken from storage and mounted to plate cylinders, printing members are vulnerable to damage at numerous handling stages.

One type of plate damage results from deposition of contaminants that alter the affinity characteristics of the affected area. For example, oily contaminants deposited onto the hydrophilic area of a wet plate, or onto the oleophobic area of a dry plate, will attract ink and cause its application to areas of the recording medium that should remain blank. Such contaminants can originate with a variety of sources—even from fingerprints left by the press operator in the course of handling and mounting the plate. Surface scratching can produce a similar reversal of affinity. For example, damage to the oleophobic surface of a dry plate exposes the underlying oleophilic layer, thereby causing inappropriate application of ink to the recording medium.

Deletion fluids have been developed for gross correction of such damage. In a wet-plate system, such fluids typically etch away chemically the ink-receptive contaminant, re-exposing the underlying hydrophilic layer. For dry plates, silicones in liquid form are applied to plate areas rendered improperly ink-receptive, thereby re-establishing oleophobicity. It is also possible to create, rather than delete, ink-receptivity in selected plate areas to ameliorate imaging errors or other forms of damage. Obviously, fluids used to alter plate affinity are most easily applied to relatively large non-image areas.

Although digital imaging avoids the most cumbersome aspects of traditional platemaking, plates imaged off-press still must be manually (and sequentially) loaded onto the platemaker, imaged, inspected, then transferred to the press and mounted to their respective plate cylinders. Even plates that are imaged on-press must be withdrawn individually from their packaging and transferred to the press. Any of these handling operations can result in affinity-altering contamination.

DESCRIPTION OF THE INVENTION

The present invention reverses the usual practice of deletion by applying an oleophobic material to the hydrophilic surface of a wet plate that has suffered contamination and/or scratches. So long as the hydrophilic surface is capable of permanently bonding the oleophobic deletion agent, the areas to which that agent has been applied will not accept ink (although the mechanism of ink abhesion will be due, in those areas, to direct ink repulsion rather than adsorption of fountain solution).

The approach of the present invention is particularly applicable to plates having ceramic or metallic inorganic hydrophilic surface layers (hydrophilic, that is, in the printing sense of accepting fountain solution). These surfaces bond well with, for example, moisture-cure silicone compositions, which are preferred oleophobic application agents for the present application. Such compositions may include commercial products such as the the ST-1 STOP OUT deletion fluid sold by Toray Industries Inc., Urayasu, Chiba, Japan. More generally, moisture-cure compositions are usually based on silanol (—Si—OH) terminated polydimethylsiloxane polymers (which are most commonly linear). The silanol group will condense with any of a number of multifunctional silanes included in the composition, which is formulated to undergo reaction in the presence of environmental, airborne moisture.

In particular, acetoxy, alkoxy or oxime functional groups are subject to hydrolysis by water to liberate a silanol-functional silane which can then condense with the silanol groups of the base polymer. A particularly favored approach is to use acetoxy-functional silanes, because the byproduct, acetic acid, contributes to an acidic environment favorable for the condensation reaction. A catalyst can be added to promote the condensation when neutral byproducts are produced by hydrolysis of the silane.

A first type of plate to which the present invention may be applied is shown in FIG. 1. The depicted plate construction includes, in its most basic form, a substrate 10 and a surface layer 12. Substrate 10 is preferably strong, stable and flexible, and may be a polymer film, or a paper or thermally insulated metal sheet. Polyester films (in a preferred embodiment, the MYLAR film sold by E.I. duPont de Nemours Co., Wilmington, Del., or the MELINEX film sold by ICI Films) furnish useful examples. A preferred polyester-film thickness is 0.007 inch, but thinner and thicker versions can be used effectively.

Paper substrates are typically "saturated" with polymerics to impart water resistance, dimensional stability and strength. Aluminum is a preferred metal substrate. Ideally, the aluminum is polished so as to reflect any imaging radiation penetrating any overlying optical interference layers. One can also employ, as an alternative to a metal reflective substrate 10, a layer containing a pigment that reflects imaging (e.g., IR) radiation. A material suitable for use as an IR-reflective substrate is the white 329 film supplied by ICI Films, Wilmington, DE, which utilizes IR-reflective barium sulfate as the white pigment. A preferred thickness is 0.007 inch, or 0.002 inch if the construction is laminated onto a metal support as described hereinbelow.

Layer 12 is a very thin (50–500 Å, with 300 Å preferred for titanium) layer of a metal that may or may not develop a native oxide surface 12*s* upon exposure to air. This layer ablates in response to IR radiation, and an image is imposed onto the plate through patterned exposure to the output of one or more lasers (as disclosed, for example, in U.S. Pat. No. 5,385,092, the entire disclosure of which is hereby incorporated by reference). The metal or the oxide surface thereof exhibits hydrophilic properties that provide the basis for use of this construction as a lithographic printing plate. Imagewise removal, by ablation, of layers 12/12*s* exposes underlying layer 10, which is oleophilic; accordingly, while layers 12/12*s* accept fountain solution, layer 10 rejects fountain solution but accepts ink. Complete imagewise ablation of layer 12 is therefore important in order to avoid residual hydrophilic metal in an image feature.

The metal of layer 12 is at least one d-block (transition) metal, aluminum, indium or tin. In the case of a mixture, the metals are present as an alloy or an intermetallic. Again, the development, on more active metals, of an oxide layer can create surface morphologies that improve hydrophilicity. Such oxidation can occur on both metal surfaces, and may also, therefore, affect adhesion of layer 12 to substrate 10 (or other underlying layer). Substrate 10 can also be treated in various ways to improve adhesion to layer 12. For example, plasma treatment of a film surface with a working gas that includes oxygen (e.g., an argon/oxygen mix) results in the addition of oxygen to the film surface, improving adhesion by rendering that surface reactive with the metal(s) of layer 12. Oxygen is not, however, necessary to successful plasma treatment. Other suitable working gases include pure argon, pure nitrogen, and argon/nitrogen mixtures. See, e.g., Bernier et al., *ACS Symposium Series* 440, *Metallization of Polymers, p.* 147 (1990).

If the plate shown in FIG. 1 is scratched, revealing the underlying oleophilic surface, ink will undesirably adhere to the affected area of the plate. The same will be true if an oleophilic contaminant is deposited onto the surface 12/12*s*.

In either case, application of an oleophobic agent to the contaminated area or over the area where layers 12/12*s* have been penetrated prevents the unwanted adsorption of ink.

Figure 2:
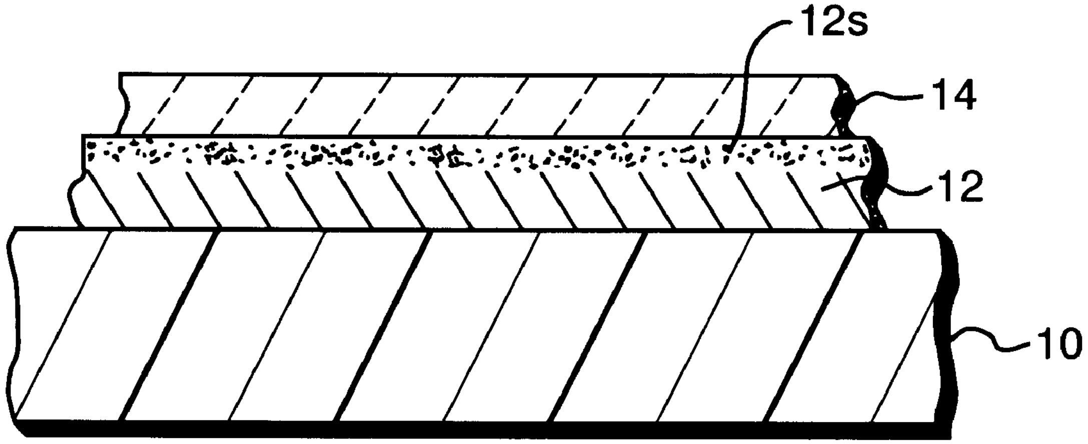

Refer now to FIG. 2, which illustrates a second type of plate to which the present invention may be applied. The illustrated construction includes a hard, durable, hydrophilic layer 14 disposed directly above layer 10 or, more preferably, is above a metal layer 12, since addition of the metal layer tends to improve overall adhesion. In the latter case, layer 12 may or may not contain an oxide interface 12*s*.

Layer 14 is a metallic inorganic layer comprising a compound of at least one metal with at least one non-metal, or a mixture of such compounds. Along with underlying layer 12/12*s*, layer 14 ablatively absorbs imaging radiation, and consequently is applied at a thickness of only 100–2000 Å. Accordingly, the choice of material for layer 14 is critical, since it must serve as a printing surface in demanding commercial printing environments, yet ablate in response to imaging radiation.

The metal component of layer 14 may be a d-block (transition) metal, an f-block (lanthanide) metal, aluminum, indium or tin, or a mixture of any of the foregoing (an alloy or, in cases in which a more definite composition exists, an intermetallic). Preferred metals include titanium, zirconium, vanadium, niobium, tantalum, molybdenum and tungsten. The non-metal component of layer 14 may be one or more of the p-block elements boron, carbon, nitrogen, oxygen and silicon. A metal/non-metal compound in accordance herewith may or may not have a definite stoichiometry, and may in some cases (e.g., Al—Si compounds) be an alloy. Preferred metal/non-metal combinations include TiN, TiON, $TiO_x$ (where $0.9 \leqq x \leqq 2.0$), TiAlN, TiAlCN, TiC and TiCN.

Certain species are not suited to use in layer 14. These include the chalcogenides, sulfur, selenium and tellurium; the metals antimony, thallium, lead and bismuth; and the elemental semiconductors silicon and germanium present in proportions exceeding 90% of the material used for layer 14; and compounds including arsenic (e.g., GaAs, GaAlAs, GaAlInAs, etc.). These elements fail in the context of the present invention due to poor durability, absence of hydrophilicity, chemical instability and/or environmental and toxicity concerns.

Once again, deposition of oleophilic contaminant onto the surface of layer 14, or breach of that layer (and any underlying layer(s)) to reveal substrate 10, results in inappropriate ink receptivity. This is eliminated through application of the oleophobic agent in accordance with the present invention. The oleophobic agent cures to a hardened state and adheres to layer 14 where it is applied (as well as to any exposed portion of layer 10, although this is less critical if internal cohesion and adhesion to layer 14 (or 12) are sufficient).

Generally, the plate is dry when the oleophobic agent is applied. For example, in a typical operation, the press is stopped, ink is wiped off the plate, and the plate surface is then wiped with isopropanol (to clean residual ink and remove water).

It will therefore be seen that the foregoing approach can conveniently ameliorate various types of damage to a variety of wet lithographic printing plates. The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. A method of eliminating an unwanted oleophilic area from a wet-printing lithographic member, the member comprising a hydrophilic, metallic inorganic surface layer and an oleophilic layer thereunder, the surface layer being substantially removed in an imagewise pattern, the method comprising bonding an oleophobic agent to the unwanted oleophilic area so as to render the area oleophobic during printing.

2. The method of claim 1 wherein the oleophobic agent is silicone.

3. The method of claim 2 wherein the silicone is a moisture-cure silicone.

4. The method of claim 1 wherein the unwanted oleophilic area is an oleophilic deposit on the surface layer.

5. The method of claim 1 wherein the unwanted oleophilic area is an exposed portion of the oleophilic area.

6. The method of claim 1 wherein the surface layer of the member comprises a compound of at least one metal with at least one non-metal, the at least one non-metal being selected from the group consisting of boron, carbon, nitrogen, silicon and oxygen.

7. The method of claim 6 wherein the surface layer comprises at least one of (i) a d-block transition metal, (ii) an f-block lanthanide, (iii) aluminum, (iv) indium and (v) tin.

8. The method of claim 6 wherein the surface layer is titanium nitride and the oleophilic layer is polyester.

9. The method of claim 8 wherein the member further comprises a layer of titanium between the titanium nitride layer and the oleophilic layer.

10. The method of claim 6 wherein the surface layer comprises a boride.

11. The method of claim 6 wherein the surface layer comprises a carbide.

12. The method of claim 6 wherein the surface layer comprises a nitride.

13. The method of claim 6 wherein the surface layer comprises a carbonitride.

14. The method of claim 6 wherein the surface layer comprises a silicide.

15. The method of claim 6 wherein the surface layer comprises an oxide.

16. The method of claim 6 wherein the surface layer is selected from the group consisting of TiN, TiC, TiCN, $TiO_x$ (where $0.9 \leqq x \leqq 2.0$), TiON, TiAlN and TiAlCN.

17. The method of claim 1 wherein the surface layer is a metal having thereon a native oxide coating.

* * * * *